United States Patent [19]

Leonard et al.

[11] Patent Number: 5,115,162
[45] Date of Patent: May 19, 1992

[54] ACTUATION RESPONSIVE BRAKE PEDAL PAD ASSEMBLY

[75] Inventors: Mark L. Leonard, Redford; Loren H. Uthoff, Jr., Canton, both of Mich.; Jerome K. Hastings, Sussex, Wis.

[73] Assignee: Eaton Corporation, Cleveland, Ohio

[21] Appl. No.: 510,643

[22] Filed: Apr. 18, 1990

[51] Int. Cl.⁵ .................................. H01L 41/08
[52] U.S. Cl. .................. 310/339; 310/800; 341/34; 303/DIG. 3
[58] Field of Search ............... 310/338, 339, 366, 800; 303/DIG. 3; 341/34

[56] References Cited

U.S. PATENT DOCUMENTS

| | | | |
|---|---|---|---|
| 3,239,696 | 3/1966 | Burkhalter et al. | 310/339 |
| 3,395,485 | 1/1976 | Yoshida et al. | 310/340 |
| 4,190,785 | 2/1980 | Kompanek | 310/338 X |
| 4,521,712 | 6/1985 | Braun et al. | 310/339 |
| 4,618,797 | 10/1986 | Cline | 310/339 |
| 4,857,887 | 8/1989 | Item | 341/34 |

Primary Examiner—Mark O. Budd
Attorney, Agent, or Firm—R. A. Johnston

[57] ABSTRACT

A pressure sensitive pad assembly for a brake pedal having in one embodiment a pair of plastic films with metallized surfaces spaced apart by apertured spaces and embedded in an elastomeric pad to be placed on a brake pedal. Application of a brake actuating force on the pad causes the elastomer to deform closing contact between the metallized surfaces for actuating a brake light. In another embodiment a pressure sensitive transducer pad assembly has embedded in elastomeric material, a plurality of piezoelectric strips which are deformed, upon application of a brake actuating force to the pad, for providing an electrical signal indicative of the magnitude of the brake actuating force. In another embodiment an elastomeric pad spans a shallow recess in a support with piezoelectric material provided on the spanning surface and deformation of the pad into the recess deforms the piezoelectric material to provide a brake actuating force signal.

10 Claims, 3 Drawing Sheets

ACTUATION RESPONSIVE BRAKE PEDAL PAD ASSEMBLY

BACKGROUND OF THE INVENTION

The present invention relates to devices for providing electrical indication of user-actuation of vehicle brake servoactuator lever arm. The present invention provides a pad assembly for the pedal provided on the brake servoactuator arm with the pad assembly providing an electrical signal indicative of the vehicle operator applying an actuation force to the brake pedal.

Heretofore it has been common practice to provide an electrical switch having the actuator member thereof disposed to sense movement of the pivoted brake servoactuator arm for actuating a switch to energize the vehicle brake lights or stop lamps or other vehicle accessory. Where brake servo lever arm switches are utilized for sensing movement of the arm a minimum amount of movement of the brake pedal has been required in order that the sensing switch can be properly positioned or calibrated for actuation at the time of installation. This is because of the mechanical motion disadvantage of the switch actuator being installed when it is typically between the brake arm pivot and the pedal which is mounted on the end of the lever arm. If a very sensitive switch actuator, as for example a microswitch, is employed, it is extremely difficult to adjust the switch on its mounting in order to properly sense movement of the brake pedal arm from its at-rest position against a resilient stop as typically employed for quietness of operation. If a relatively long-travel switch actuator is employed to render the installation and switch calibration easier, then a prohibitive amount of brake pedal movement is experienced before the sensing switch can close the circuit and the brake actuation signal is delayed for a prohibitively long period of time.

It has thus long been desired to provide a way or means of providing an electrical signal responsive to initial user application of a brake actuating force to the brake pedal in a manner which eliminates the necessity of calibration of a sensing switch with respect to the at-rest and actuated positions of the brake pedal arm.

SUMMARY OF THE INVENTION

The present invention provides a unique and novel pad assembly for application on a vehicle brake pedal provided on the end of a pivoted brake servoactuator lever arm. The pad assembly of the present invention comprises an elastomeric pad having the electrically responsive mechanism embedded in the elastomeric material for providing an electrical indication of user application of an actuating force to the surface of the pad.

In one embodiment the elastomeric pad assembly of the present invention operates as a pair of electrical contacts to close a circuit to provide a signal for actuating the vehicle brake lights, or other vehicle accessory.

In other embodiments the pad assembly employs piezoelectric strips embedded therein which are deformed, upon the application by the user of a force to the surface of the elastomeric pad, to thereby provide an electrical signal indicative of the amount of deformation which is generally proportional to the magnitude of the applied force. The present invention thus provides an electrically responsive brake pedal pad assembly which is highly sensitive to the application of a user actuation force to the surface of the pad for providing an electrical signal indicative thereof.

In one embodiment a pair of plastic film strips having a metallized surface are disposed on opposites of an apertured insulating spacer and are embedded in the elastomeric brake pad. Upon application of a brake pad actuating force to the surface of the pad the metallized strips are deformed into the apertures of the spacer and make contact therein to close a circuit for brake light actuation, or other accessory circuit.

In other embodiments of the invention piezoelectric strips are employed embedded in the elastomeric pad in such a manner that relaxation means adjacent the piezoelectric strips permit ready deformation of the piezoelectric material to provide electrical signal responsive to the applied force to the pad. The relaxation means may comprise a recess on one side of the piezoelectric material or elastomeric material of softer composition than the surrounding material.

The electrical signal output from the pad may be fed directly to electronic circuitry located in the support base for the pad on the pedal arm thereby providing for remote actuation of devices such as vehicle accessories related to the braking effort.

BRIEF DESCRIPTION OF THE DRAWINGS

FIGS. 1 and 2 is a portion of a section view of the electrical contacts of the embodiment of FIGS. 1 and 2 in the closed or actuated condition;

DETAILED DESCRIPTION

Figure 1:
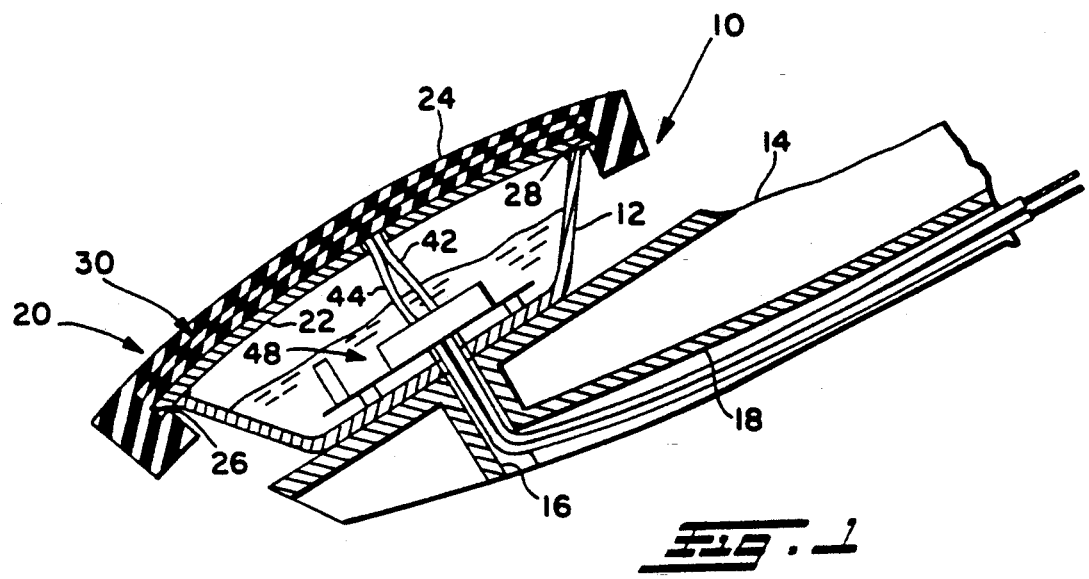
FIG. 1 is a section view of the present invention installed on a brake servoactuator arm.

Referring to FIG. 1, the invention is illustrated generally at 10 as a brake pad assembly having a cup-shaped rigid support 12 attached to the end of a brake servoactuator lever arm 14 which is typically pivoted on the vehicle structure about the end thereof (not shown) remote from the end illustrated in the drawings. Arm 14 has a wiring access hole 16 and a wiring harness channel 18 provided therein for routing of electrical leads therein.

A cover plate 22 is rigidly attached by any suitable means over the support 12 and provides a rigid backing for the pressure sensitive pad means indicated generally at 20 which is adapted to have a brake actuating force applied by the user or vehicle operator to the outer surface 24 thereof. In the presently preferred practiced, the pad means 20 is formed generally of resilient flexible material such as elastomeric material and has grooves 26, 28 formed in the end portions thereof which are received over the ends of the cover plate 22 which preferably extend outwardly over the support 12 by a minimum amount necessary to provide retention of the pad means 20.

Pad means 20 has an electrical sensor indicated generally at 30 embedded therein for providing an electrical signal upon application of a brake actuating force to surface 24 of the pad means 20.

Figure 2:
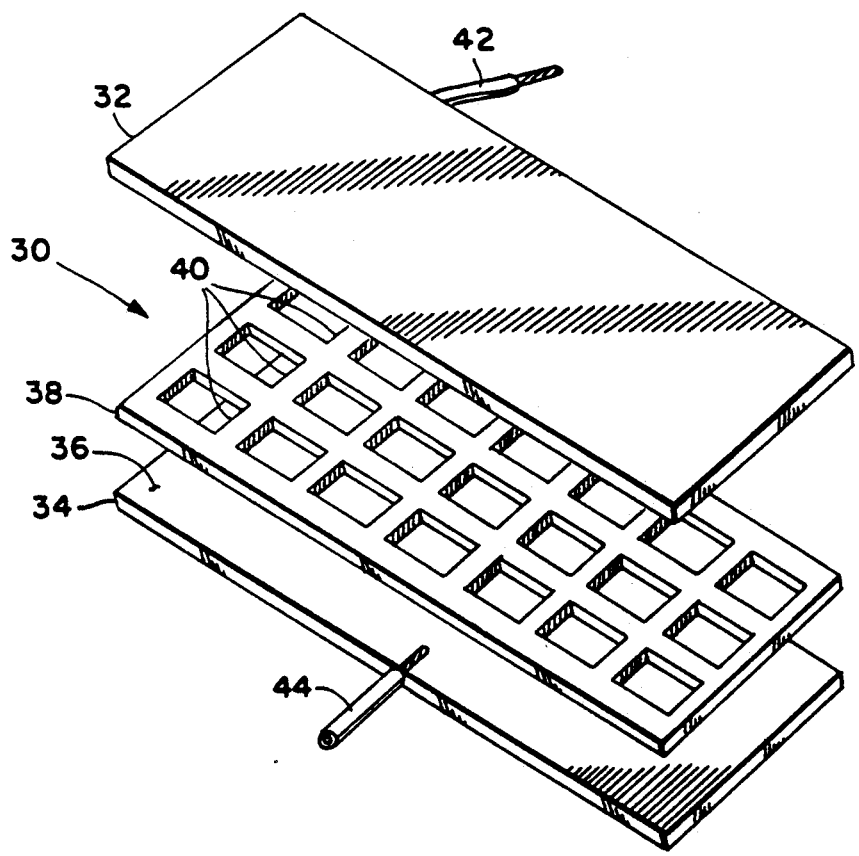
FIG. 2 is an exploded view of the construction of the electrical switch in the embodiment of FIG. 1.

Referring to FIG. 2, one embodiment of the sensor 30 is illustrated in exploded view as comprising an upper contact strip 32 formed of flexible, preferably plastic, material of a relatively thin configuration and disposed in spaced parallel arrangement with a complementary plastic strip 34. The strips 32, 34 each have adjacent surfaces thereof coated with a suitable electrically conductive metallized coating the coated surface of strip 34 being denoted by reference numeral 36 in FIG. 2. The strips may be formed of a suitable plastic such as polyethylene terrephalate polyester material.

Strips 32, 34 are separated by a distance corresponding to the thickness of a insulating spacer 38 which has a plurality of spaced apertures 40 formed therein in a grid pattern. The spacer 38 is formed of any suitable electrically insulating material as for example polyvinyl chloride plastic. The apertures 40 are sufficiently large to permit strips 32 to be deformed and have the metallized surfaces thereof make contact within the aperture.

Figure 3:
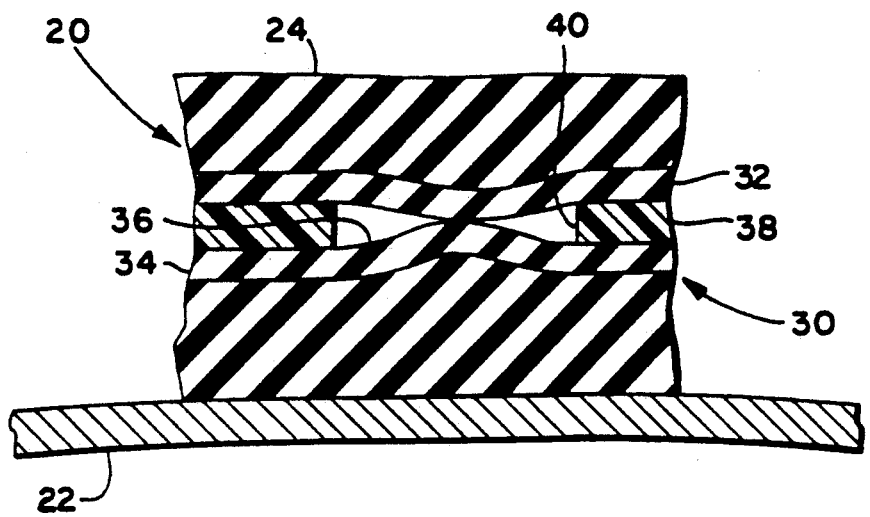

Referring to FIG. 3, the embodiment of FIG. 2 is shown in the brake actuated condition wherein the ad means 20 has a braking force applied thereto sufficient to deform elastomeric material to cause the metallized contact surface 36 of lower layer 34 to make contact with the corresponding metallized layer of the upper strip 32 by deformation through one of the apertures 40 in the spacer plate 38.

Referring to FIG. 2, an electrical lead 44 is attached to the metallized surface 36 and a separate lead 42 is attached to the metallized undersurface of strip 32.

Referring to FIG. 1, the leads 42, 44 extend downwardly through an aperture 46 provided in the cover plate 22 for connection to electronic signal processing means indicated generally at 48 potted in the interior of the support 12.

Figure 4:
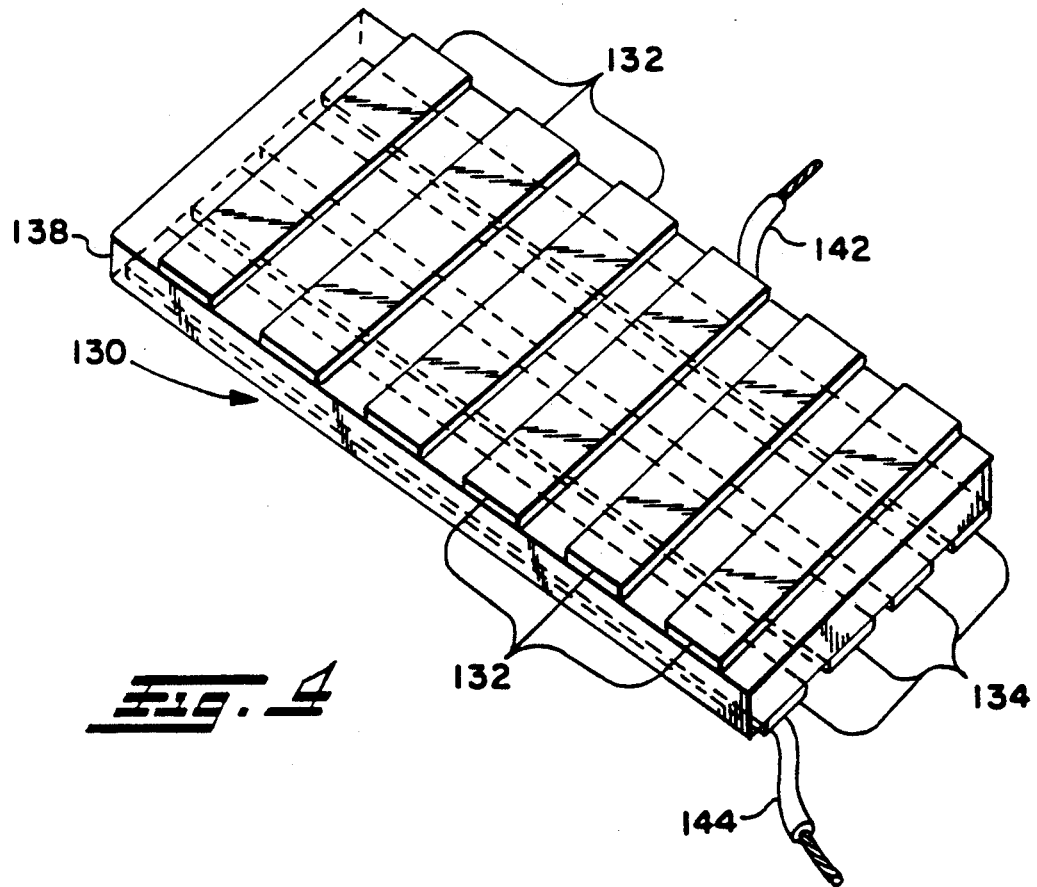
FIG. 4 is an axonometric view of an alternate embodiment of the electrical components for the device of FIG. 1.

Referring to FIG. 4, an alternate embodiment of the sensor 130 is illustrated as having a relaxation means comprising spacer 138 formed of elastomeric material preferably of a softer composition or lower durometer on the Shore "A" scale than the elastomeric material of the balance of the pad means 20. The embodiment of FIG. 4 has a plurality of strips of piezoelectric material 132 disposed in spaced parallel arrangement on the upper surface of the spacer 138 with the strips connected to suitable electrical leads such as lead 142 for passage through aperture 46 in the support plate 22 (see FIG. 1).

A second layer of strips of piezoelectric material indicated by the reference numeral 134 in FIG. 4 is disposed in spaced parallel relationship on the undersurface of the elastomeric spacer 138. Strips 134 are preferably disposed generally at right angles to the strips 132 on the upper surface of the spacer 138.

Figure 5:
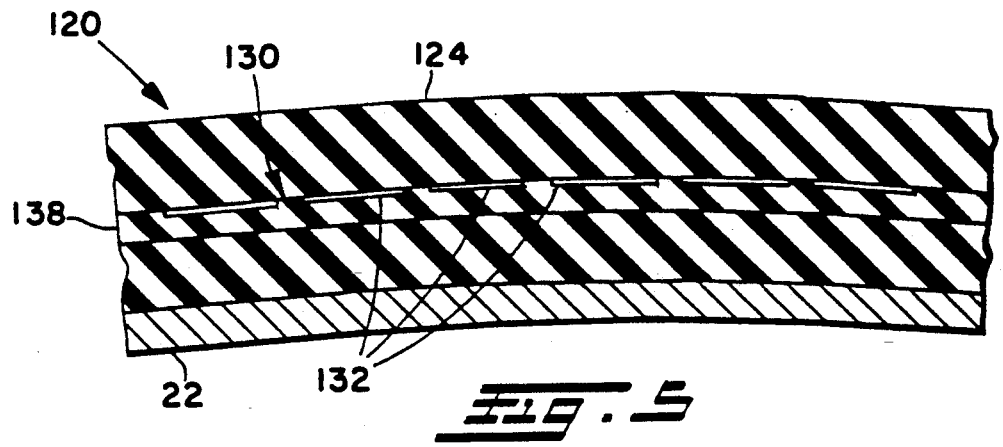
FIG. 5 is a portion of a section view of the embodiment of FIG. 4.

A cross-section of the embodiment of FIG. 4 is shown in FIG. 5 wherein the strips 132 are shown in position on the spacer 138 when the sensor 130 is embedded in pad means 120 which has a surface 124 adapted for having a braking force applied thereto.

Figure 6:
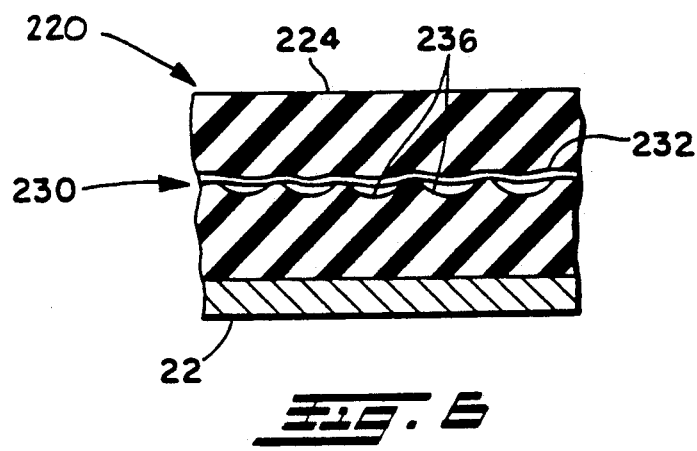
FIG. 6 is a portion of section similar to FIG. 5 and shows an alternate arrangement thereof.

Referring to FIG. 6, another embodiment of the invention is shown wherein pad means 220 has a sensor 230 embedded therein which comprises a layer of piezoelectric strips disposed in spaced parallel relationship one of which is denoted by reference numeral 232 in FIG. 6 have a plurality of spaced parallel recesses 236 formed in the elastomeric material adjacent the lower surface of the strips 232. The recesses 224 comprise the relaxation means for permitting downward deflection of spaced regions of the strip 232 upon application of a brake actuating force to the surface 224 of the pad means 20. The strips such as strip 232 are shown in the deformed state in FIG. 6 as the strip would appear with the brake actuating force applied to surface 224. It will be understood that although in the embodiment of FIG. 6 only a single layer of strips is illustrated, that a second layer may be provided spaced between the layer 232 and the cover plate 22 similar to the spacing and arrangement of the strips of the embodiment of FIG. 4.

Figure 7:
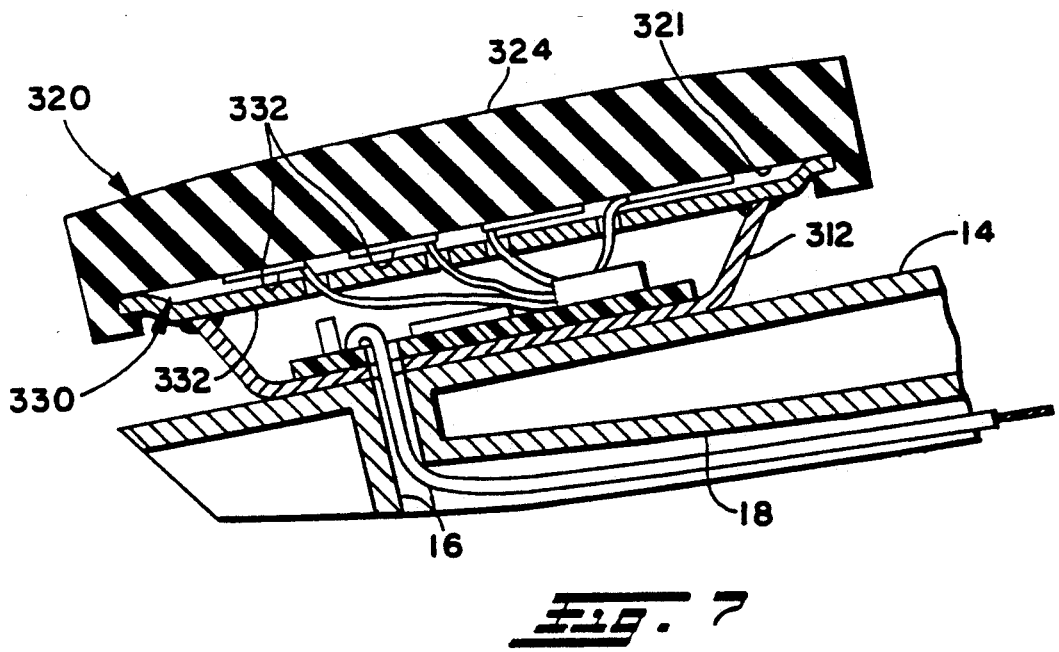
FIG. 7 is a view similar to FIG. 1 of another embodiment of the invention.

Referring to FIG. 7, another embodiment of the invention is shown wherein the pad means 320 comprises an integral block of elastomeric material having a sensor 330 which comprises a flat undersurface 321 having a plurality of spaced parallel piezoelectric strips 332 disposed thereon. Pad means 320 has the upper surface 324 thereof adapted for receiving a brake actuating force thereon. The support means 312 mounted to a brake servoactuator arm 14 is bridged by a cover 322 which has the edges thereof upturned to form a recess or channel below the strips 332, which channel comprises the relaxation means for the piezoelectric strips 332. Upon application of a brake actuating force to the surface 324 the flat surface 321 is deflected downward into the recess and strips 332 are correspondingly deformed to provide an electrical signal indicative of the brake actuating force applied to surface 324.

The present invention thus provides a novel and convenient way of providing an electrical signal indicative of application of a brake actuating force to a brake pedal by providing pressure-sensitive sensor means embedded in an elastomeric brake pedal pad.

In one embodiment the sensor comprises spaced metallized surfaces on plastic film which are deformed in apertures in a spacer to make contact thereby completing a circuit for brake light or stop lamp illumination or other vehicle accessory.

In another embodiment the sensor comprises upper and lower layers of piezoelectric strips spaced by suitable relaxation means which may be either soft elastomer or recesses provided in the elastomer to permit deformation of the strips upon application of a brake actuating force to the surface of the pad. In another embodiment the cover plate for mounting of the elastomeric pad has the undersurface spaced a slight amount above and bridging a recess in the support plate for providing the relaxation means as a recess to which the elastomeric pad may be deformed thereby causing piezoelectric strips to provide an output signal indicative of the applied brake actuating force. The assembly of the present invention provides a cup-shaped support which may, if desired, have electronic circuitry for signal conditioning potted therein to thereby permit signal conditioning for remote control functions associated with the braking effort. The present invention thus provides a unique electrical brake actuation force sensor which may be attached to the brake servoactuator arm or mounting on the brake pedal attached to the end of the brake actuating arm.

Although the invention has hereinabove been described with respect to the illustrated embodiments, it will be understood that the invention is capable of modification and variation and is limited only by the following claims.

We claim:

1. A pressure-sensitive brake pedal transducer comprising:
   (a) support means adapted for attachment to a vehicle brake pedal arm;

(b) pad means received on said support means, said pad means formed of resilient flexible material having embedded therein,
  (i) a spacer layer of resiliently deformable electrically insulating material.
  (ii) a first plurality of spaced generally parallel strips disposed on one side of said spacer layer said strips formed of relatively thin piezoelectric material.
  (iii) a second plurality of spaced generally parallel strips disposed on the side of said spacer opposite said one side, said second plurality of strips formed of relatively thin piezoelectric material and disposed to extend generally at right angles to said first plurality of strips, wherein upon application of a brake actuating force to said pad means, some of said first plurality and some of second plurality of strips are simultaneously individually deformed to give separate electrical signals indicative of said actuating force.

2. The transducer defined in claim 1, wherein said separate electrical signals are combined to give an electrical signal indicative of the force applied to said pedal.

3. The transducer defined in claim 1, wherein said spacer layer is formed of polyvinyl chloride plastic material.

4. A pressure-sensitive brake pedal transducer comprising:
  (a) rigid support means adapted for attachment to a vehicle brake;
  (b) pressure-sensitive pad means received on said support means, said pad means formed of resilient elastomeric material having embedded therein:
    (i) at least one layer of spaced generally parallel strips formed of piezoelectric material,
    (ii) relaxation means disposed adjacent one side of said strips and operative to provide less resistance to flexing of said strips than said elastomeric material on the side of said strip opposite said one side, wherein upon application of a brake actuating force to said pad means, some of said strips are deformed into said relaxation means to give electrical signals indicative of said actuating force.

5. The transducer defined in claim 4, wherein said relaxation means comprise a layer of elastomeric material having substantially lower durometer than the balance of said pad means.

6. The transducer defined in claim 4, wherein said relaxation means comprises a plurality of recesses formed in the elastomeric material adjacent each of said strips.

7. A pressure sensitive transducer assembly for a brake pedal comprising:
  (a) support means adapted for attachment to be brake servoactuating arm, said support means defining a generally shallow recess therein;
  (b) pad means formed of elastomeric material received on said support means and bridging said recess to define a void of predetermined depth therebetween; and,
  (c) at least one strip of piezoelectric material attached to the surface of said pad means bridging said recess;
  (d) electrical lead means connected to said piezoelectric material and extending exteriorly of said recess, wherein, upon application of a braking force to said pad means, said elastomeric and piezoelectric material are deflected into said recess, wherein said piezoelectric material provides an electrical signal indicative of said force on said lead means.

8. The transducer assembly defined in claim 7, wherein said support means has a generally cup-shaped configuration.

9. The transducer assembly defined in claim 7, wherein said pad means comprises an integrally formed elastomeric member attached to said support means at the margins thereof.

10. The transducer assembly defined in claim 7, wherein said support means includes means defining a chamber separate having electrical amplifying means therein.

* * * * *